United States Patent [19]

Hilal

[11] Patent Number: 4,978,853
[45] Date of Patent: Dec. 18, 1990

[54] FLUX-MOTION INDUCED BOLOMETER BASED ON CERAMIC SUPERCONDUCTIVE ELEMENTS

[75] Inventor: Mohamed A. Hilal, Madison, Wis.

[73] Assignee: International Superconductor Corp., N.Y.

[21] Appl. No.: 325,658

[22] Filed: Mar. 17, 1989

[51] Int. Cl.$^5$ .......................................... H01L 39/00
[52] U.S. Cl. .................................. 250/336.2; 505/849
[58] Field of Search ..................... 250/336.2; 505/848, 505/849; 374/176

[56] References Cited

U.S. PATENT DOCUMENTS

| | | | |
|---|---|---|---|
| 3,193,685 | 7/1965 | Burstein | 25/336.2 |
| 4,869,598 | 9/1989 | McDonald | 374/176 |
| 4,873,443 | 10/1989 | Schneider | 250/336.2 |

Primary Examiner—Carolyn E. Fields

[57] ABSTRACT

A novel high sensitivity superconductive bolometer is presented in which the detector is kept in its superconducting state during the functional phase. Operation is based on detecting an induced fluxoid motion following a temperature rise caused by impinging infrared radiation. The superconductive-flux-motion-induced bolometer consists of a superconductive film and a pick-up film which are electrically insulated from each other. As the temperature of the current carrying film rises, fluxoid motion is triggered, sweeping through both films so that a voltage is detected in the pick-up film. The superconductive-flux-motion-induced bolometer has higher sensitivity for detection of infra-red radiation than any bolometer known heretofore.

9 Claims, 4 Drawing Sheets

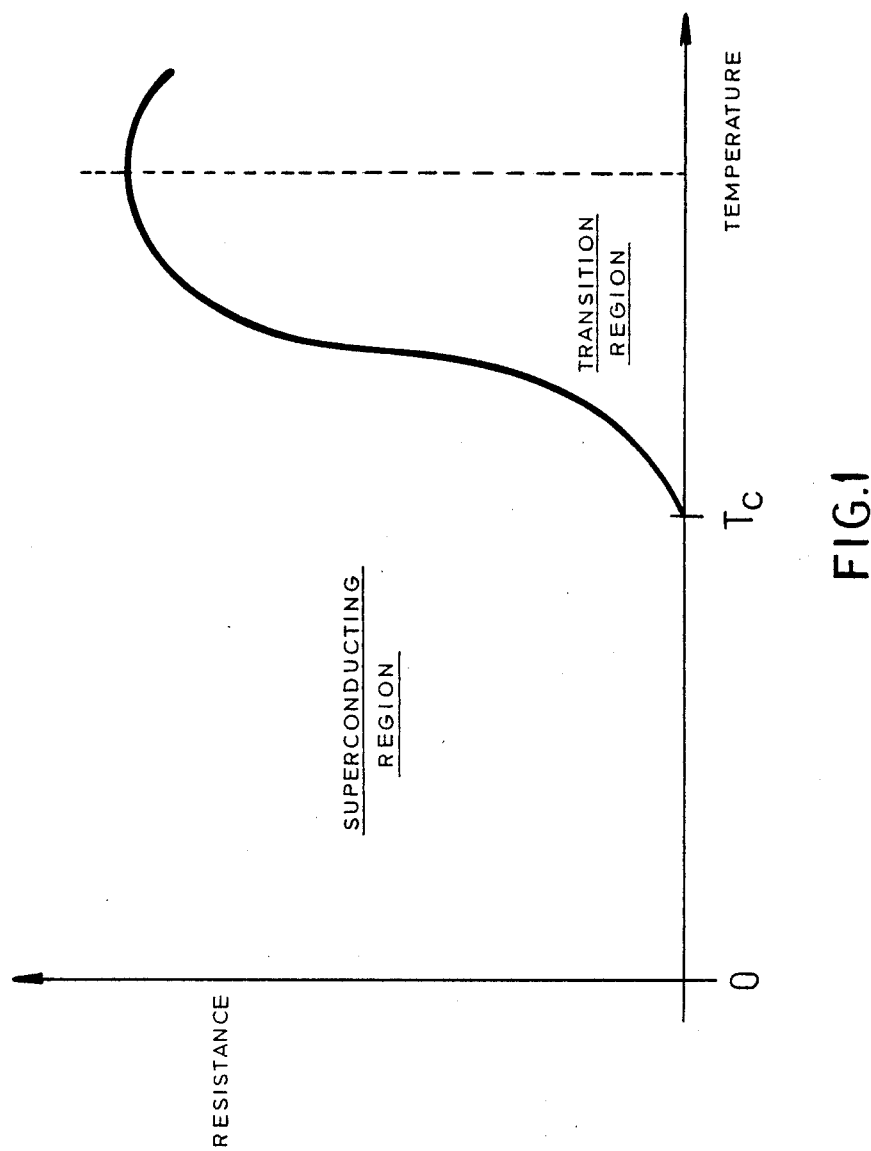

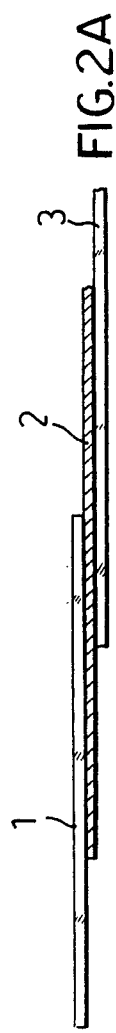
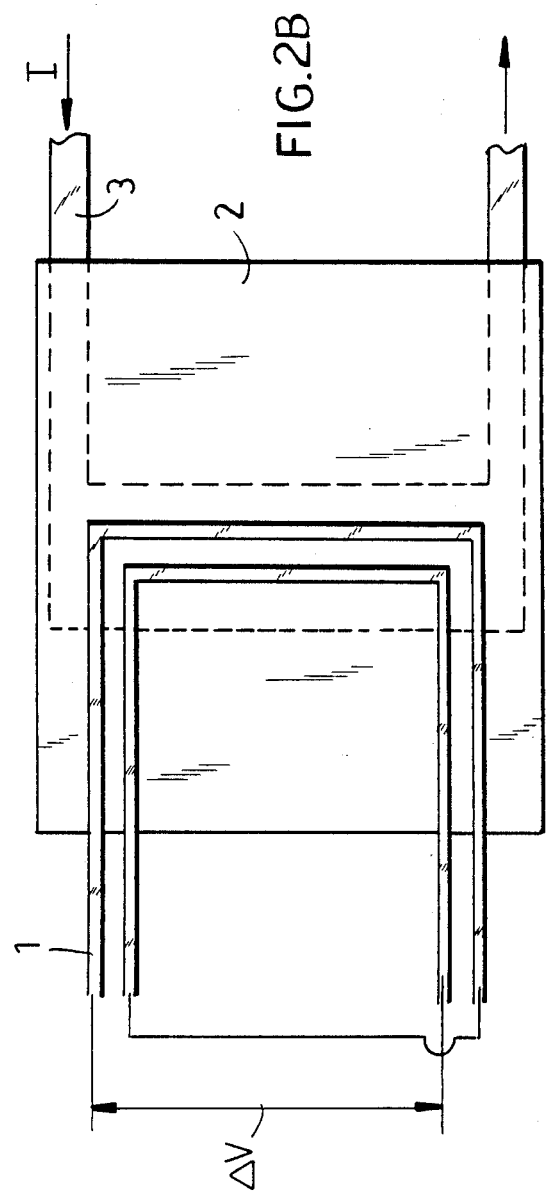

FLUX-MOTION INDUCED BOLOMETER BASED ON CERAMIC SUPERCONDUCTIVE ELEMENTS

BACKGROUND OF THE INVENTION

The discovery of ceramic compositions having superconducting properties is recent. Originally, superconductivity was observed in mercury at 4 K by the Dutch scientist, Heike Onnes in 1911. The term, superconductivity, refers to the property wherein a normally resistive conductor abruptly loses all resistance to electrical flow at a specific temperature, called the critical temperature, $T_c$. At this point, the resistivity of the normal conductor becomes zero, i.e. the material becomes superconducting. In more recent times, Ogg (1946) studied superconductivity in quenched metal-ammonia solutions and proposed that superconductivity arose because of mobile electron-pairs. About 1973, it was determined that certain niobium metal alloys, i.e. Nb-Sn, exhibited superconductivity when cooled to liquid helium (4 K) temperatures. Later results raised this temperature as high as 23 K ($-250°$ C.). Until recently, it was believed that superconductivity above this temperature was not possible because of the theoretical work of Bardeen, Cooper and Schieffer (BCS theory-1946) which predicted such a limit. Several theoretical proposals were presented in the 1970's, suggesting that the critical temperature for superconductivity could be increased. However, the lack of any discoveries of superconductivity above 23 K solidified the belief that indeed this temperature could not be exceeded. Thus, when Bednorz and Muller announced, in November 1987, the discovery of a new ceramic superconducting compound based on lanthanum, barium, and copper oxides with a critical temperature for superconductivity close to 35 K., (G. Bednorz and A. Müller, Z. Phys., B64 189 (1986)), the declaration was greeted with considerable skepticism. Nevertheless, by the following month, the critical temperature, $T_c$, for the onset of superconductivity was raised to nearly 80 K by C. W. Chu and coworkers (M. K. Wu, J. R. Ashburn, C. J. Tang, P. H. Hor, R. L. Meng, L. Gao, Z. J. Huang, Y. Q. Wang and C. W. Chu, Phys. Rev. Lett. 58 908 (1987)). This was achieved by changing the composition to yttrium barium copper oxide, approximated by the formula:

$$Y_{1.0} Ba_{1.8} Cu_{3.0} O_{6.3}$$

This formula, determined experimentally, is not exactly stoichiometric. It is believed that this lack of specific nonstoichiometry contributes most to the onset of superconductivity. The mechanism of superconductivity in such oxide-based ceramic materials is not at all well understood. Ogg's original contribution suggested that superconductivity arose in quenched metal-ammonia solutions because of mobile electron pairs. The concept accepted at present is similar (the BCS theory), and suggests that if a mobile electron propagates through a lattice structure, it will normally interact with the bound electrons of the lattice because of differences in electron quantum spin number, and interact with the quantized vibrations of the lattice as well (vibronic coupling). However, if two such electrons form a pair which are bound through opposite spin-pairing (Cooper pairs), then no quantum interaction of the bound pairs can occur with the electrons of the lattice (which still have an electronic moment), or by vibronic coupling. That the BCS theory has some validity is shown by the following consideration. The so-called 1:2:3 compound, composed of Y—Ba—C—O atoms, is prepared by the solid state reaction of the requisite oxides, vis:

$$Y_2O_3 + 2BaO + 3CuO = 2YBa_2Cu_3O_{6.5}.$$

It is now established (C. N. Rao et al, Nature, 327 185 (1987)) that high $T_c$ superconductivity in the Y—Ba—Cu—O system originates from a compound of stoichiometry: $YBa_2Cu_3O_7$-¶, where "¶" is a value less than 1.0. This compound has the structure of the ideal perovskite, $YBa_2CU_3O_9$. Thus, the superconductor $YBa_2Cu_3O_7$-¶ has about 25% fewer oxygen atoms present in the lattice as compared to the idealized cubic perovskite structure. This massive oxygen deficiency means that instead of the conventional three-dimensional crystalline cubic-stacking array of the perovskite, a unique layered structure results. A loss of even more oxygen atoms in this structure gives rise to the semiconductor, $YBa_2Cu_3O_6$. The chain of copper atoms associated with a chain of oxygen atoms is believed to be the key to superconducting behavior. Yet the above description is an idealized one and the actual distinct structural conformation has not yet been delineated. Note that there appear to be extra oxygen atoms in the superconducting unit cell, compared to that of the semiconductor.

To date, most of the high-$T_c$ superconducting ceramic compositions announced to date are based on cuprate compounds having $CuO_2$ layers as part of the structure. Some of these have included:

| Bismuth Strontium Calcium Copper Oxide |
|---|
| $Bi_2 Sr_{3-x} Ca_x Cu_2 O_{8+y}$ |
| $T_c = 114$ lK. |
| Thallium Calcium (Barium) Copper Oxide |
| Tl $Ba_2$ Ca $Cu_2$ $O_7$ |
| Tl $Ba_2$ $Ca_2$ $Cu_3$ $O_9$ |
| Tl $Ba_2$ $Ca_3$ $Cu_4$ $O_{11}$ |
| Tl $Ba_2$ $Ca_4$ $Cu_5$ $O_{13}$ |
| $T_c = 120$ lK. |
| Lead Strontium Lanthanide Copper-Oxide |
| $Pb_2Sr_2(Nd_{0.76}Sr_{0.24})Cu_3O_{8+x}$ |
| $T_c = 77$ lK. |

In the last compound given, the $CuO_2$-sheets are present but there is also a PbO-Cu-OPb sandwich as well, not observed in ceramic superconductors heretofore. The copper ions in this sandwich are monovalent and each is coordinated, above and below, to two oxygen atoms in the PbO layers. The copper atoms in the $CuO_2$ sheets have an average valence of about 2.25, which is consistent with previously known cuprate compounds, given above. However, the presence of $Cu^+$ atoms lowers the average valence of copper ions in the new structure to below 2.0, which is atypical. Indeed, preparation conditions needed to prepare these compounds includes a mildly reducing atmosphere so as not to oxidize $Pb^{2+}$ to $Pb^{4+}$.

There have also been some compositions announced, based on a copper-free composition, vis:

$$BAO-K_2O-Bi_2O_3$$

This compound is said to become superconducting at about 30 K. While copper-oxide superconductors exhibit layered structures that carry current efficiently only along certain planes, this new material is a three-dimensional network of bismuth and oxygen with properties that are much less sensitive to crystallographic direction. It is hoped that compositions will be discovered in this system with temperature properties that rival those of copper-bearing compounds.

Superconducting compositions have been traditionally prepared by calcining carefully formulated mixtures of oxides. For example, to prepare the $YBa_2Cu_3O_7$-¶ superconducting phase, one weighs out 0.5 mol of $Y_2O_3$, 2.0 mol of BaO, 3.0 mol cf CuO, and mixes them thoroughly. The mixture is then calcined at elevated temperature, in an oxidizing atmosphere, whereupon the oxides undergo solid state reaction to form a single phase with superconducting properties at 78 K. Alternately, one can choose compounds which decompose to form oxides which react to form the desired phase, when heated to elevated temperature.

Once the powder has been prepared, it can be handled by conventional means and processed to desirable forms. One such method employs a slurry of powder and methanol. By casting a uniform film on a suitable substrate such as sapphire, one can dry it, calcine it, and obtain a dense, uniform layer. However, a reannealing step in oxygen atmosphere is usually required to restore the critical oxide stoichiometry required for superconductivity.

There have been a number of methods used to prepare these ceramic superconducting compounds in useful form. One method deposits thin layers of the appropriate metal oxides in specific order on a silicon substrate by electron-beam evaporation. Another approach to preparation of superconducting films of $Bi_2Sr_{3-x}Ca_x Cu_2O_{8+y}$ has been to employ compounds which are volatile and to cause them to decompose on a hot surface in a partial vacuum. This method, known as vapor phase epitaxy, is capable of producing a superconductive monocrystalline film, using halogen compounds (or others) as the source materials, provided that suitable annealing in an oxygen atmosphere is carried out. Still another method for preparing superconductors in useful form has been the formation of a bar of the ceramic composition. Said bar was then heated on a pedestal by a LASER until it melted, a seed crystal was added, and a fiber was drawn at a controlled rate. The prototype wire was able to carry 30,000 $A/cm^2$ at 4 K. before it failed, but was subject to the shortcomings of all ceramic fibers, namely flexibility and ductility.

Superconductive bolometers have been under investigation since 1946 to develop ultra-sensitive infrared detectors. (D. H. Andrews, R. M. Milton, and W. DeSorbo, "A Fast Superconducting Bolometer", J. Opt. Soc. Amer., 36(9), 518–524, (1946)). The sensitive element of such detectors is a metallic superconducting film evaporated on a substrate such as mica, sapphire, or quartz. The film temperature is controlled so it is in the transition region as shown in the accompanying FIG. 1. Incident infrared radiation causes the film temperature to rise, which results in an increase of the film resistance. The incident radiation power can be determined by measuring the resistance increase as long as the transition region characteristics are maintained. Accurate control of the film temperature is required prior to detection so that temperature fluctuations are small compared to signal produced by the temperature rise. In an alternative method, the film temperature is maintained just below the transition temperature (K. Weiser, U. Strom, S. A. Wolf, and D. U. Gubser, "Use of Granular NbN as a Superconducting Bolometer," J. Appl. Phys. 52, 1888–9, 1981). Incident radiation then causes the temperature of the film to rise above the transition temperature pf the superconductor, thus causing the film to become partially normal in conductivity. The film resistance is measured to determine the radiation flux.

OBJECTS OF THE INVENTION

I have determined that a superconductive-flux-motion-induced bolometer can be constructed whose operation does not require the film temperature to be in the transition region between superconductivity and normal conductivity and does not require the superconducting to normal transition to take place. Temperature control is less critical in this case as long as detection time is short. I have also determined that operation of the superconductive-flux-motion-induced bolometer is simpler and the sensitivity of detection of infrared radiation is much greater than any known heretofore.

Therefore, an object of this invention is to provide improved superconductive-flux-motion-induced bolometer.

Another object is to provide a superconductive-flux-motion-induced bolometer having sensitivities for detection of infra-red radiation much greater than any known heretofore.

Still another object is to provide of a superconductive-flux-motion-induced bolometer in which the detection state does not have to be maintained midway between the superconducting and normal states.

A final object is to provide a superconductive-flux-motion-induced bolometer whose operation is simpler than that of the prior art, and whose operation can be accomplished at liquid nitrogen temperatures (78 K.) rather than that of liquid helium, i.e. 4 K.

SUMMARY OF THE INVENTION

The superconductive-flux-motion-induced bolometer of the invention consists of: (a) a pick-up film composed of a selected ceramic superconducting composition, deposited on one side of a substrate, and (b) a type-II superconductor film deposited on the other side of the substrate.

BRIEF DESCRIPTION OF THE DRAWING

The above and other objects, features and advantages of the present invention will become more readily apparent from the following description, reference being made to the accompanying drawing in which:

FIG. 1 is a graph in which resistance is plotted against temperature and showing a resistance characteristic of a superconducting film deposited upon a substrate;

FIG. 2A is a cross sectional view and

FIG. 2B is a plan view showing a bolometer according to the invention wherein a type II superconductor film is connected to a constant-current source through a small inductor and detection is achieved by measuring the voltage signal across the pick-up film when the type II film is exposed to radiation, the bolometer being cooled below its transition temperature and the constant current being less than the critical current;

SPECIFIC DESCRIPTION

This invention relates to superconductive-flux-motion-induced bolometer having sensitivities for detection of infra-red radiation much higher than any known heretofore. This invention also relates to designs of superconductive-flux-motion-induced bolometers wherein the superconducting detector does not have to be maintained midway between the superconducting and normal states. This invention also relates to a superconductive-flux-motion-induced bolometer whose operation is simpler than that of the prior art, and whose operation can be accomplished at liquid nitrogen temperatures (78 K.) rather than that of liquid helium, i.e. 4 K.

The superconductive-flux-motion-induced bolometer consists of: (a) a pick-up film 1 composed of a selected ceramic superconducting composition, deposited on one side of a substrate 2, and (b) a type-II superconductor film deposited on the other side of the substrate. A schematic of the bolometer is shown in FIGS. 2A and 2B. The type-II superconductor film is connected to a constant current source not shown which is connected via a small inductor to the superconducting film. Detection is achieved by measuring the voltage signal V across the pick-up film 1 when the type-II film is exposed to radiation.

Figure 3:
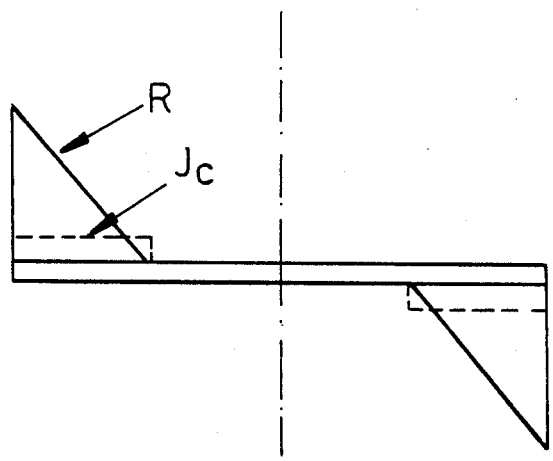
FIG. 3 is a graph showing a magnetic field distribution across the film of the embodiment of FIGS. 2A and 2B, the temperature of the type II superconductor film increasing as it is exposed to the radiation source resulting in critical current density reduction and magnetic-field distribution such that, as fluxides move across the type II film to conform to the required description, they cause a signal in the second film.

In actual operation, the bolometer is cooled below its transition temperature and a constant current, less than the critical current, is allowed to flow through the type-II film. The magnetic field distribution across the film is schematically shown in FIG. 3. As the type-II SC film is exposed to the radiation source, its temperature increases, resulting in critical current density reduction and magnetic field redistribution. Fluxoids move across the type-II film to conform to the required distribution, thereby causing a signal in the second film.

The second film can be a thin metallic or a type-I superconductor film 1 so that the field can penetrate the superconductor in its intermediate state. Making the insulating layer thin and smaller than the penetration depth will result in having the flux bundles persisting as discrete entities in the type-I superconducting film. In some cases, they may coalesce some distance away which can be advantageous. A voltage is thus generated in the second film due to the fluxoid motion and is used to determine the radiation intensity. As the flux lines move across the film, a transient signal is produced as the fluxoids cross the detection film. I have determined that it is possible to detect the signal frequency so as to determine the total flux flow across the film. Signal frequency detection has been found more feasible if the second film is also superconducting. If a non-superconductor is used, fluxoids do not preserve their identities and the voltage signal is more uniform. However, sensitivity of detection of the signal frequency is lowered. The induced voltage can be approximately estimated to determine the bolometer sensitivity by using the following theory.

Let the thickness and the width of the film to be w and h respectively. Assuming that the magnetic field distribution is linear across the film width, FIG. 3, the current penetration depth is approximately given by:

$$\delta = 0.5 . I/(J_c . h) \quad (1)$$

where $J_c$ is the critical current density. As the film temperature rises, the current density decreases and results in redistribution of the induced magnetic field. Assuming that the magnetic field at the film edge is constant and keeping the current constant, we have:

$$\Phi \approx 0.25 . \mu . (I/h) \quad (2)$$

where is the total flux penetrating the film over half the film width. Note that the total flux penetrating the film is zero as long as it is not exposed to an external field. The change in , over half the film thickness as the temperature increases, is given by:

$$\Phi = -0.125 . \mu . (I/hJ_c)^2 \Delta J_c \quad (3)$$

where $\Delta J_c$ represents the reduction in critical current density.

The induced voltage, V, is given by:

$$V = -0.25 . \mu . \delta . (J/J_c) 2 . (dJ_c/dT) . (dT/dt) \quad (4)$$

and the above equation can be reduced to:

$$V = -0.25 . \mu . \delta . (J/J_c)^2 . (dJ_c/dT) . (q/mc) \quad (5)$$

The bolometer sensitivity, S, then is given by:

$$S = V/q = -0.25 . \mu \delta . (J/J_c) 2 . (dJ_c/dT)/mc \quad (6)$$

The superconductive-flux-motion-induced bolometer sensitivity assuming the parameters given in Table 1 is 80 kV/W.

TABLE 1

| Typical Bolometer Parameters | |
|---|---|
| C, Volumetric Heat Cap. | 100 J/m3 |
| $\Phi$, Film Width | 2 mm |
| h, Film thickness | 1 m |
| dJc/dT | 109 A/m2 |
| S, Sensitivity | 80 kV/W |

I have also found that it is possible to replace the type-I film with a pick up coil but in this case, the sensitivity is greatly reduced. The pick-up coil detects the total flux change, which can be very small if it is not in the vicinity of the type-II superconductive film. It may be also noted that the flux redistribution will not necessarily result in appreciable total flux change and a multi-turn pick up coil may be required. The design of the coil configuration will depend on the magnetic flux distribution. Frequency detection is only possible using the second superconducting film since this method requires preserving the fluxoid identity.

Figure 4:
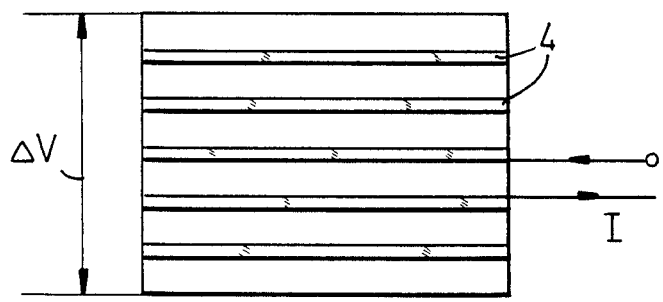
FIGS. 4 and 5 are views similar to 2B illustrating other embodiments of the invention.
Figure 5:
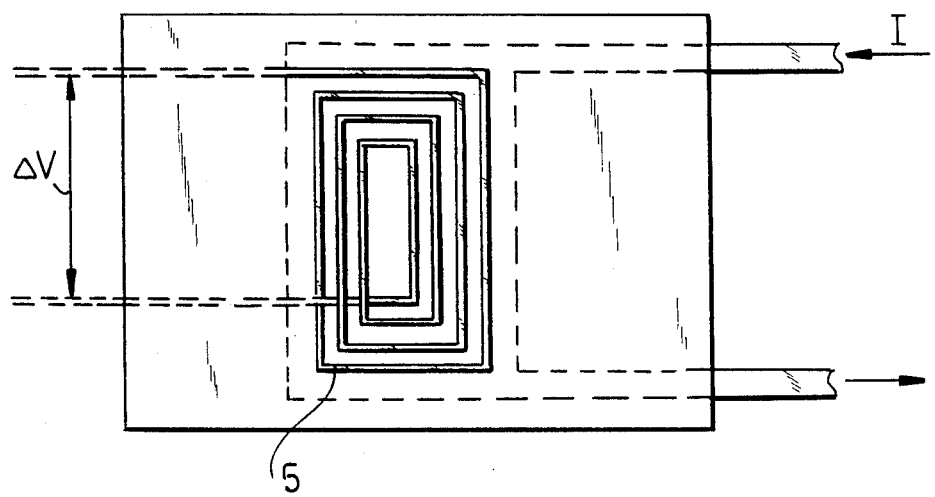

The sensitivity of the superconductive-flux-motion-induced bolometer can be further increased by having multiple layers 4 of detection film, as shown in FIG. 4. It is also possible to increase the superconductive-flux-motion-induced bolometer sensitivity by depositing the detection thin film to form multiple 5 as shown in FIG. 5.

I have established that the superconductive-flux-motion induced bolometer is superior to other superconducting detectors for the following reasons:

1. The temperature control is less critical. The bolometer output depends primarily on the temperature rise of the film and is less dependent on its absolute temperature.

2. Minimum joule losses are generated since the bolometer is always in the superconducting state. The losses during the flux motion phase has been determined to be very small.

3. The film is capable of stable operation since no normal region exists to drive it normal.

4. The bolometer can be used at high frequency since the joule heating factor is small.

The superconductive-flux-motion-induced bolometer can be used at liquid nitrogen temperature but will have lower sensitivity due to the increased heat capacity of the film. This will be acceptable as long as it exceeds the noise level at this temperature which is true for all other bolometers. I have also discovered that the superconductive-flux-motion-induced bolometer can be operated at liquid helium temperatures when extra sensitivity is required.

Figure 6:
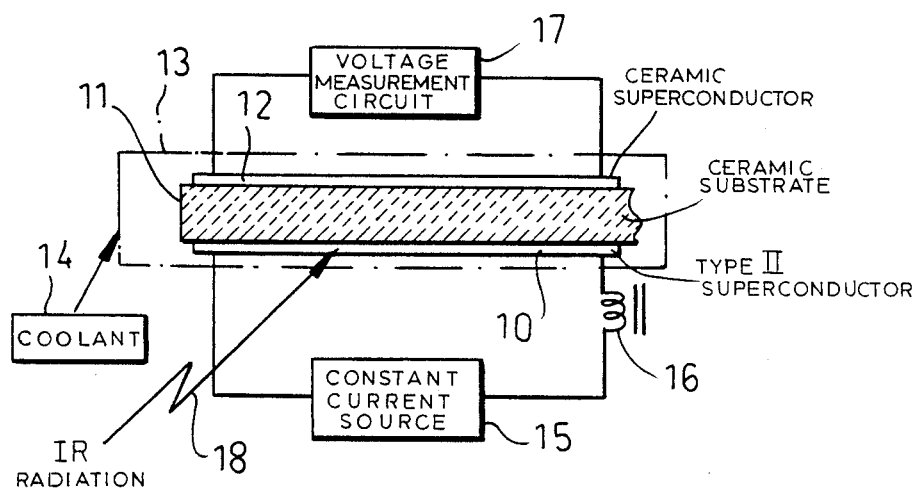
FIG. 6 is a cross sectional view of a bolometer according to the invention showing diagrammatically, circuitry with which the bolometer is associated.

FIG. 6 is a diagram of a bolometer according to the invention wherein the pickup superconductive film is shown at 10, the ceramic substrate, exaggerated in thickness, is shown at 11 and the type-II superconducting indicating film is shown at 12.

The entire assembly may be contained in a vessel 13 supplied with a coolant from a source 14, the coolant, e.g. liquid nitrogen, being sufficient to reduce the temperature of both superconductive films to a temperature below the critical temperature at which superconductivity of the films commences.

The backup superconductive film has a current passed through it from a constant current source 15 connected across this film, which may be a coil as shown in FIG. 5, via the small inductance formed by a choke 16.

A voltage measurement circuit 17 is connected across the film 12 which also may be a coil as likewise can be seen from FIG. 5.

When infrared radiation 18 impinges upon the film 10 there is a movement of fluxoids generated by the current through the film 10 which is detected by the film 12 and results in a voltage change which is a measurement of the infrared energy.

We claim:

1. A bolometer, comprising:
   a magnetic-flux-passing substrate having opposite surfaces;
   a pick-up, superconductive film on one of said surfaces for exposure to infrared radiation to be measured;
   flux-responsive indicating means along the other of said surfaces flux-coupled to said pick-up superconductive film through said substrate;
   an electric current source connectable in circuit with said pick-up superconductive film for passing an electric current therethrough;
   means connected across said flux-responsive indicating means for measuring voltage generated therein as a result of flux motion induced by infrared irradiation of said pick-up film; and
   means for cooling said film to a temperature below a critical temperature of the superconductive film.

2. The bolometer defined in claim 1 wherein said flux-responsive indicating means along the other of said surfaces includes a coil positioned to intercept magnetic flux traversing said substrate.

3. The bolometer defined in claim 2 wherein said coil is a coil formed by a metallic film.

4. The bolometer defined in claim 2 wherein said coil is a coil formed by a superconductive film.

5. The bolometer defined in claim 4 wherein said coil is formed by a type-II superconductive film on said other surface.

6. The bolometer defined in claim 1 wherein said flux-responsive indicating means along the other of said surfaces includes a superconductive film.

7. The bolometer defined in claim 6 wherein said film on said other surface is formed by a type-II superconductive film on said other surface.

8. A method of measuring infrared radiation, comprising the steps of:
   (a) providing on opposite sides of a substrate capable of passing magnetic flux, a pick-up superconductive film and an indicating superconductive film;
   (b) passing an electric current through said pick-up superconductive film;
   (c) cooling said films to a temperature below the critical temperatures thereof;
   (d) exposing said pick-up superconductive film to infrared radiation, thereby inducing flux motion in magnetic flux generated by said pick-up superconductive film, traversing said substrate and inducing a voltage in said indicating superconductive film; and
   (e) measuring the voltage induced in said indicating superconductive film.

9. The method defined in claim 8 wherein said indicating superconductive film is formed as a type-II superconductor and said pick-up film is formed as an oxide-ceramic superconductor.

* * * * *